(12) United States Patent
Fefer et al.

(10) Patent No.: US 7,969,181 B1
(45) Date of Patent: Jun. 28, 2011

(54) DEVICE AND METHOD FOR ADJUSTING AN IMPEDANCE OF AN OUTPUT DRIVER OF AN INTEGRATED CIRCUIT

(75) Inventors: Yefim Fefer, Petach Tikva (IL); Mikhail Bourgart, Modi'in (IL); Sergey Sofer, Rishon Lezion (IL)

(73) Assignee: Freescale Semiconductor, Inc., Austin, TX (US)

(*) Notice: Subject to any disclaimer, the term of this patent is extended or adjusted under 35 U.S.C. 154(b) by 83 days.

(21) Appl. No.: 12/025,030

(22) Filed: Feb. 3, 2008

(51) Int. Cl.
H03K 17/16 (2006.01)
H03K 19/0185 (2006.01)

(52) U.S. Cl. ............................................ 326/30; 326/86
(58) Field of Classification Search ..................... 326/30, 326/83; 333/124, 17.3
See application file for complete search history.

(56) References Cited

U.S. PATENT DOCUMENTS

| | | | |
|---|---|---|---|
| 6,087,847 A * | 7/2000 | Mooney et al. | 326/30 |
| 6,100,717 A * | 8/2000 | May | 326/83 |
| 6,140,885 A * | 10/2000 | Abadeer et al. | 333/17.3 |
| 6,157,206 A * | 12/2000 | Taylor et al. | 326/30 |
| 6,549,036 B1 * | 4/2003 | Lee | 326/83 |
| 6,566,911 B1 | 5/2003 | Moyer | |
| 6,791,356 B2 * | 9/2004 | Haycock et al. | 326/82 |
| 6,794,893 B2 * | 9/2004 | Lin et al. | 326/16 |
| 6,807,650 B2 | 10/2004 | Lamb et al. | |
| 7,093,145 B2 * | 8/2006 | Werner et al. | 713/300 |
| 7,151,451 B2 * | 12/2006 | Meskens et al. | 340/552 |
| 7,323,900 B2 * | 1/2008 | Kim | 326/30 |
| 7,479,800 B1 * | 1/2009 | Vullaganti et al. | 326/30 |
| 2005/0285698 A1 * | 12/2005 | Kim | 333/124 |

FOREIGN PATENT DOCUMENTS

WO 2005060193 A2 6/2005

* cited by examiner

*Primary Examiner* — Rexford N Barnie
*Assistant Examiner* — Crystal L Hammond

(57) ABSTRACT

A device and method for adjusting an impedance of an output driver of an integrated circuit; the method includes: (i) receiving, by the output driver, a first square wave signal that should be driven by the output driver to provide a second signal; (ii) monitoring, by a monitoring circuit included in the integrated circuit, the second signal during an output driver transient period resulting from a first square wave signal transient to provide a monitoring result; (iii) determining whether to adjust the impedance of the output driver in response to the monitoring result; and (iv) adjusting the impedance of the output driver in response to the determination.

20 Claims, 8 Drawing Sheets

Determining to decrease the impedance of the output driver if the first square wave signal transient is from a high level of the first square wave signal to a low level of the first square wave signal and if during the output driver transient period all temporal values of the second signal were above the first voltage threshold. 241

Determining to Increase the impedance of the output driver if during the output driver transient period a temporal value of the second signal equaled the first voltage threshold and if the first square wave signal transient is from a low level of the first square wave signal to a high level of the first square wave signal. 242

Determining to decrease the impedance of the output driver if during the output driver transient period all temporal values of the second signal were below the second voltage threshold and if the first square wave signal transient is from a low level of the first square wave signal to a high level of the first square wave signal. 243

Determining to increase the impedance of the output driver if during the output driver transient period a temporal value of the second signal equaled the second voltage threshold and if the first square wave signal transient is from a high level of the first square wave signal to a low level of the first square wave signal. 244

Determining not to adjust the impedance of the output driver if during the output driver transient period a temporal value of the second signal equaled one voltage threshold out of the first and second voltage thresholds and all other temporal values of the second signal differed from another threshold of the first and second thresholds. 245

Decreasing the impedance of the output driver if the first square wave signal transient is from a high level of the first square wave signal to a low level of the first square wave signal and if during the output driver transient period all temporal values of the second signal were above the first voltage threshold. 251

Increasing the impedance of the output driver if during the output driver transient period a temporal value of the second signal equaled the first voltage threshold and if the first square wave signal transient is from a low level of the first square wave signal to a high level of the first square wave signal. 252

Decreasing the impedance of the output driver if during the output driver transient period all temporal values of the second signal were below the second voltage threshold and if the first square wave signal transient is from a low level of the first square wave signal to a high level of the first square wave signal. 253

Increasing the impedance of the output driver if during the output driver transient period a temporal value of the second signal equaled the second voltage threshold and if the first square wave signal transient is from a high level of the first square wave signal to a low level of the first square wave signal. 254

250

FIG. 3c

DEVICE AND METHOD FOR ADJUSTING AN IMPEDANCE OF AN OUTPUT DRIVER OF AN INTEGRATED CIRCUIT

FIELD OF THE INVENTION

The present invention relates to a device having impedance adjusting capabilities and to a method for adjusting an impedance of an output driver of an integrated circuit.

BACKGROUND OF THE INVENTION

Integrated circuits are mounted on printed circuit boards. On-board interconnects can connect the integrated circuits (specifically output and/or input drivers of the integrated circuit) to an external device such as but not limited to other on-board devices (integrated or discrete) or a tester.

Modern integrated circuits are expected to output high frequency square wave signals. These signals propagate through the on-board interconnect towards the external device and vice verse.

If a characteristic impedance of the on-board interconnect and an output impedance of the output driver match, the transmitted and reflected high frequency signals propagate in a optimal manner through the on-board interconnect (transmission line) towards the external device. This impedance match can result in a minimum energy loss, optimized power dissipation, reduced noise and optimized transaction latency.

If these mentioned above impedances are not matched, various problems can arise including but not limited to significant signal integrity problems.

Setting strict impedance requirements to the printed circuit board (PCB) manufacturing is costly. This is especially actual in the cases when the PCB manufacturer is required to keep the same transmission line impedance for a group of signals or bus, like, for instance, in the data bits of the memory interfaces.

The integrated circuits manufacturing always has process technology variation, meaning that maintaining the same impedance over the entire process window is hardly achieved. To overcome this problem much over-design and yield loss are involved. In addition, the output driver impedance is always affected from operating conditions such as temperature and power supply voltage. Therefore even when the matching is achieved, it can not be kept over the entire operation period.

Thus, in many occasions the impedance of the output driver of the integrated circuit and the impedance of the on-board interconnect are not matched. This results in significant signal integrity problems, which makes design of the external interfaces of modern integrated circuits more difficult and guaranteeing of the high reliability level is costly.

There is a need to provide a device and method for reducing the mentioned above impedance mismatch and especially to keep this impedance matching over the operation period.

SUMMARY OF THE PRESENT INVENTION

The present invention provides a device and a method as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The present invention will be understood and appreciated more fully from the following detailed description of examples of embodiments taken in conjunction with the drawings in which:

FIG. 3B is a detailed view of stage 240 of FIG. 3A illustrating various embodiments that can be used for determining whether to adjust the impedance. FIG. 3C is a detailed view of stage 350 of FIG. 3A illustrating various embodiments of adjusting the impedance.

DETAILED DESCRIPTION OF PREFERRED EMBODIMENTS

The following figures illustrate examples of embodiments of the invention. They are not intended to limit the scope of the invention but rather assist in understanding some of the embodiments of the invention. It is further noted that all the figures are out of scale.

The method and device include on-chip monitoring of an output square wave signal driven by an output driver and an adjustment of the impedance of the driver in response to monitored crossings of one or more voltage thresholds during an output signal transient period. The square wave signal alternates periodically and almost instantaneously between a maximal value and a minimal value.

Figure 1:
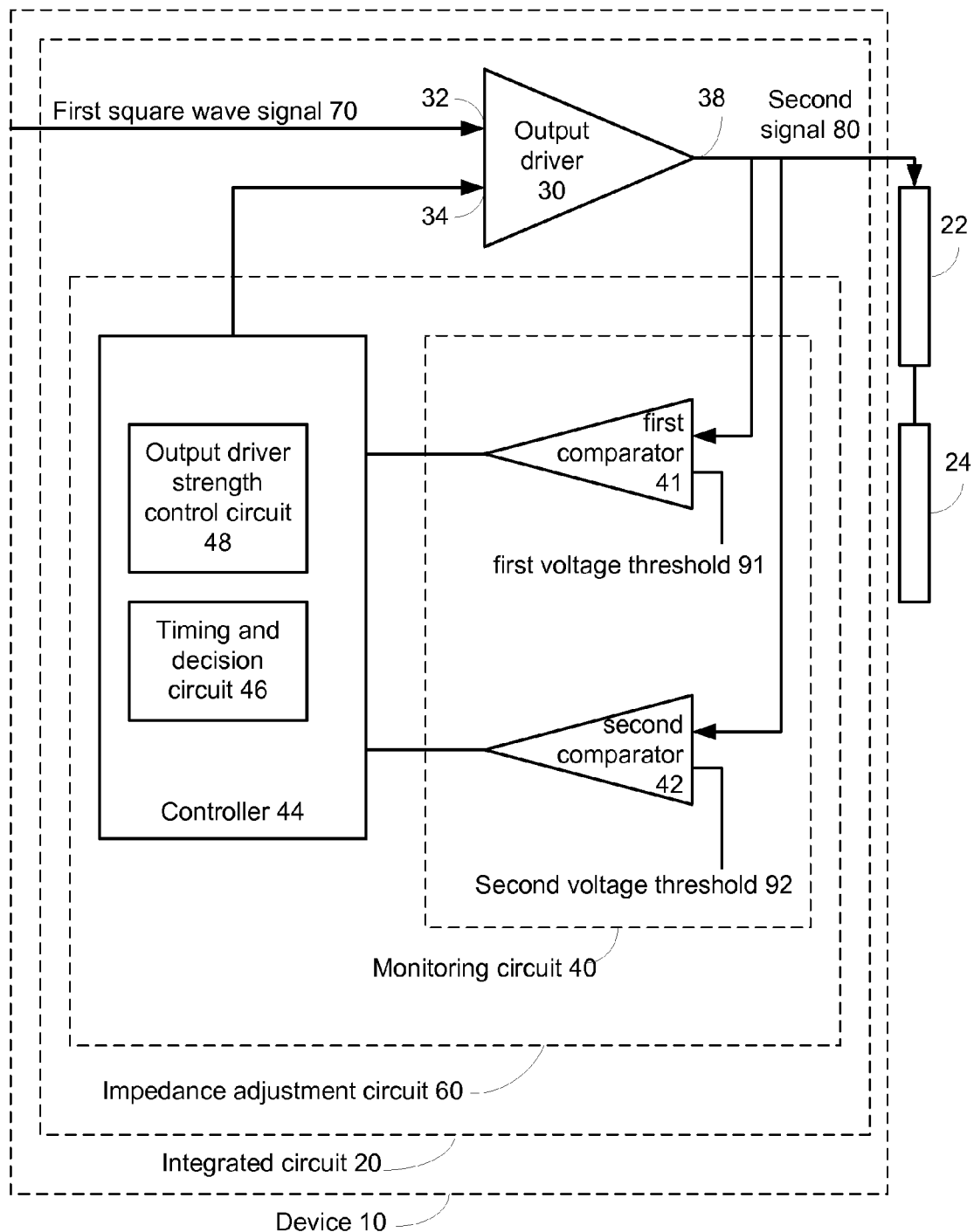
FIG. 1 illustrates an example of an embodiment of a device having impedance adjusting capabilities.

FIG. 1 illustrates device 10 having impedance adjusting capabilities. Device 10 includes integrated circuit 20 and an output driver 30 of integrated circuit 20; wherein output driver 30 receives first square wave signal 70 (via first output driver input terminal 32) and converts it to second signal 80. It is noted that second signal 80 is conveniently transmitted to external load 24 (via output driver output terminal 38), via on-board transmission line (TLS) 22 (wherein it is noted that integrated circuit 20 may include additional parasitic impedances, connecting output driver 30 to TLS 22). External load 24 is typically an "open end termination" with reasonable level of non-ideality, which is another integrated circuit on-board or any kind of testing equipment (though not necessarily so).

Device 10 is adapted to match impedances of output driver 30 and of TLS 22 (wherein additional parasitic impedances such as those aforementioned may be accounted for), so as to have second signal 80 (which is conveniently a high frequency square wave signal) propagate in a optimal manner through TLS 22 towards external load 24. The impedance match may result in a minimized, or at least reduced, energy loss, reduced noise and optimized, or at least improved, transaction latency.

If the aforementioned impedances are not matched, various problems can arise including but not limited to significant signal integrity problems. The mismatch of the impedances however, affect second signal 80 so as to enable matching impedances by adjusting of output driver 30, as described below.

Impedance adjustment circuit 60, which is included in integrated circuit 20 and is connected to output driver 30, includes monitoring circuit 40 and controller 44. Monitoring circuit 40 monitors second signal 80 during output driver transient period 100 resulting from first square wave signal transient 72 of first square wave signal 70, so as to provide a monitoring result (it is noted that various waveforms descriptive of output driver transient period, are illustrated in FIGS. 2A through 2D). Controller 44 receives the monitoring result, determines whether to adjust the impedance of output driver 30 in response to the monitoring result, and adjusts the impedance of output driver 30 in response to the determination. Conveniently, the determining is carried out by timing and decision circuit 46 that is included in controller 44. Conveniently, the adjusting is carried out by output driver strength control circuit 48 which is included in controller 44.

Figure 2A:
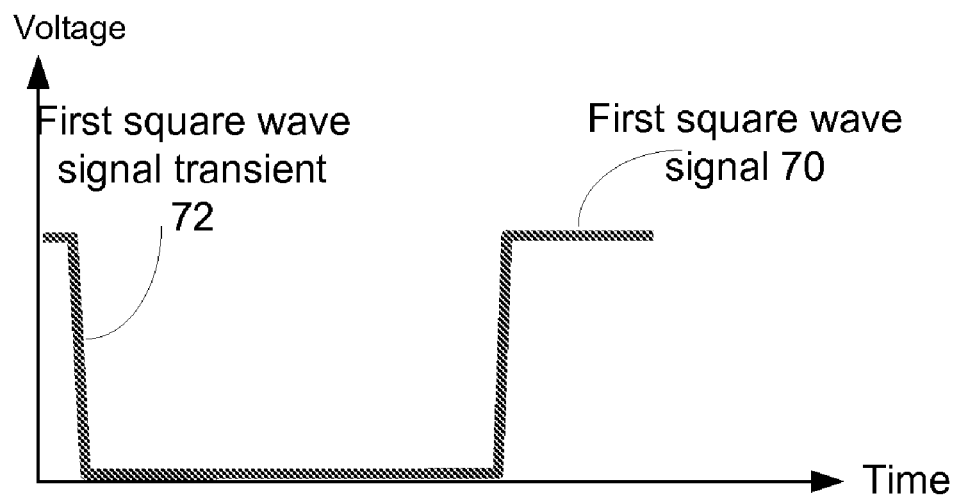
FIGS. 2A, 2B, 2C and 2D illustrate various waveforms and especially voltage thresholds crossing conditions, according to various examples of embodiments.
Figure 2A:
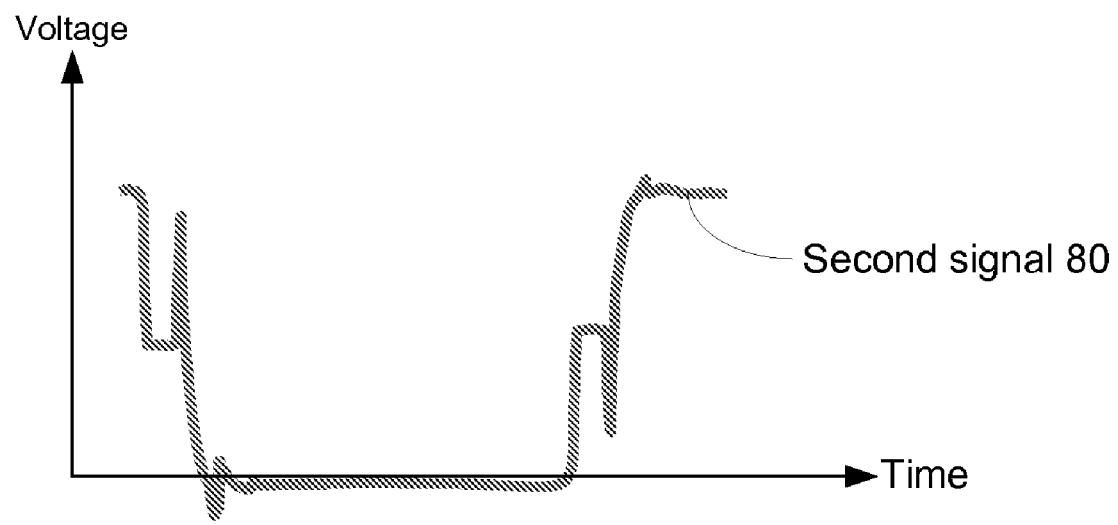
Figure 2B:
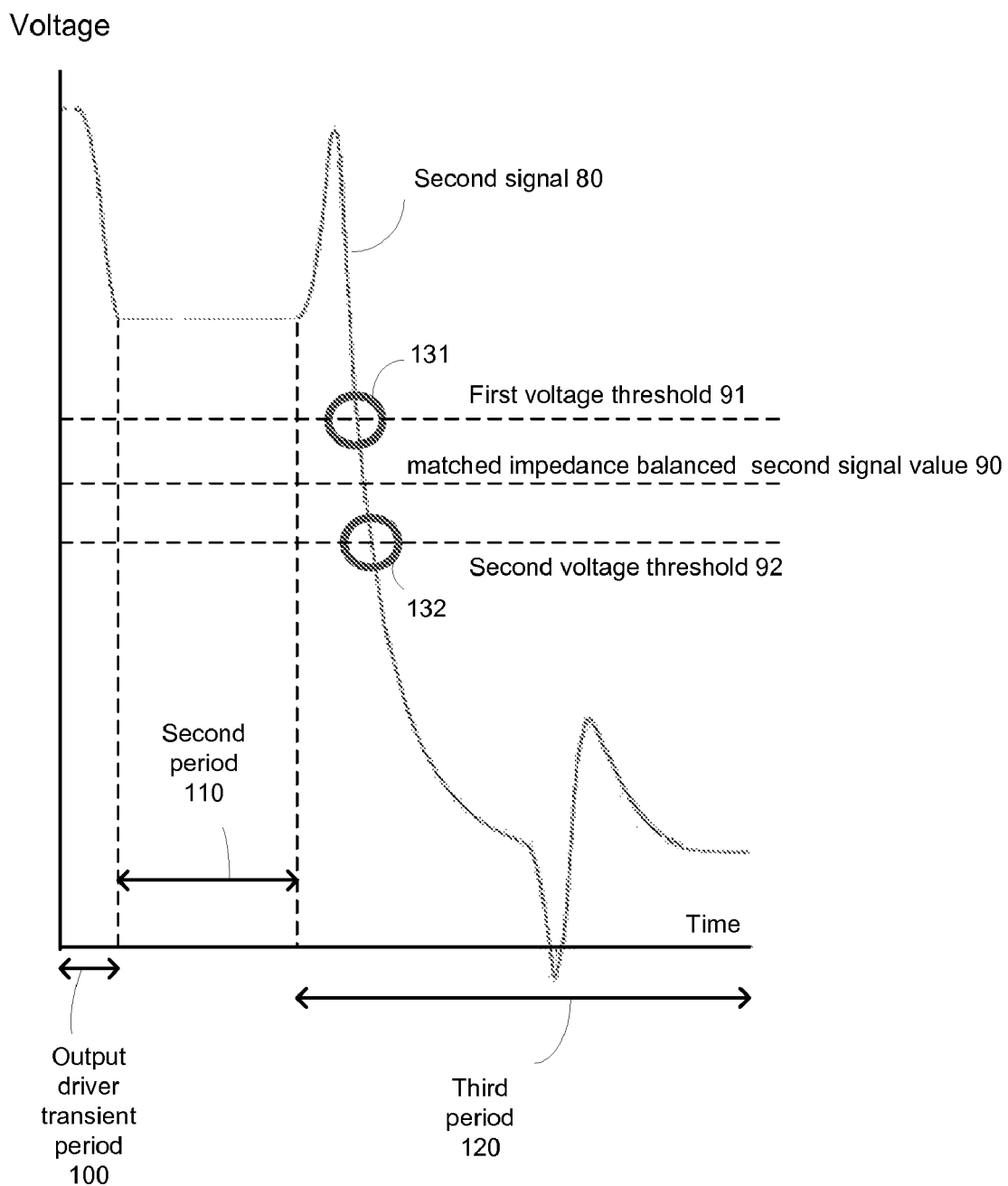
Figure 2C:
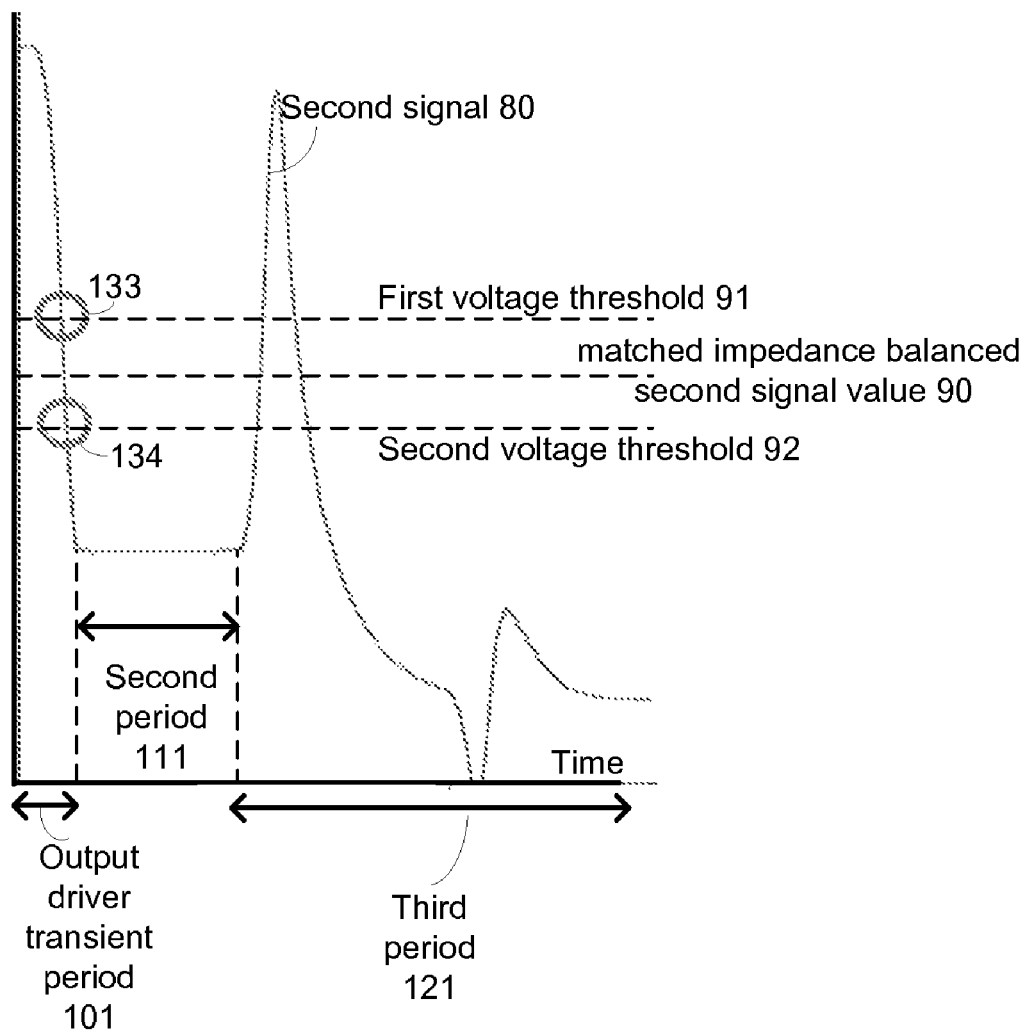
Figure 2D:
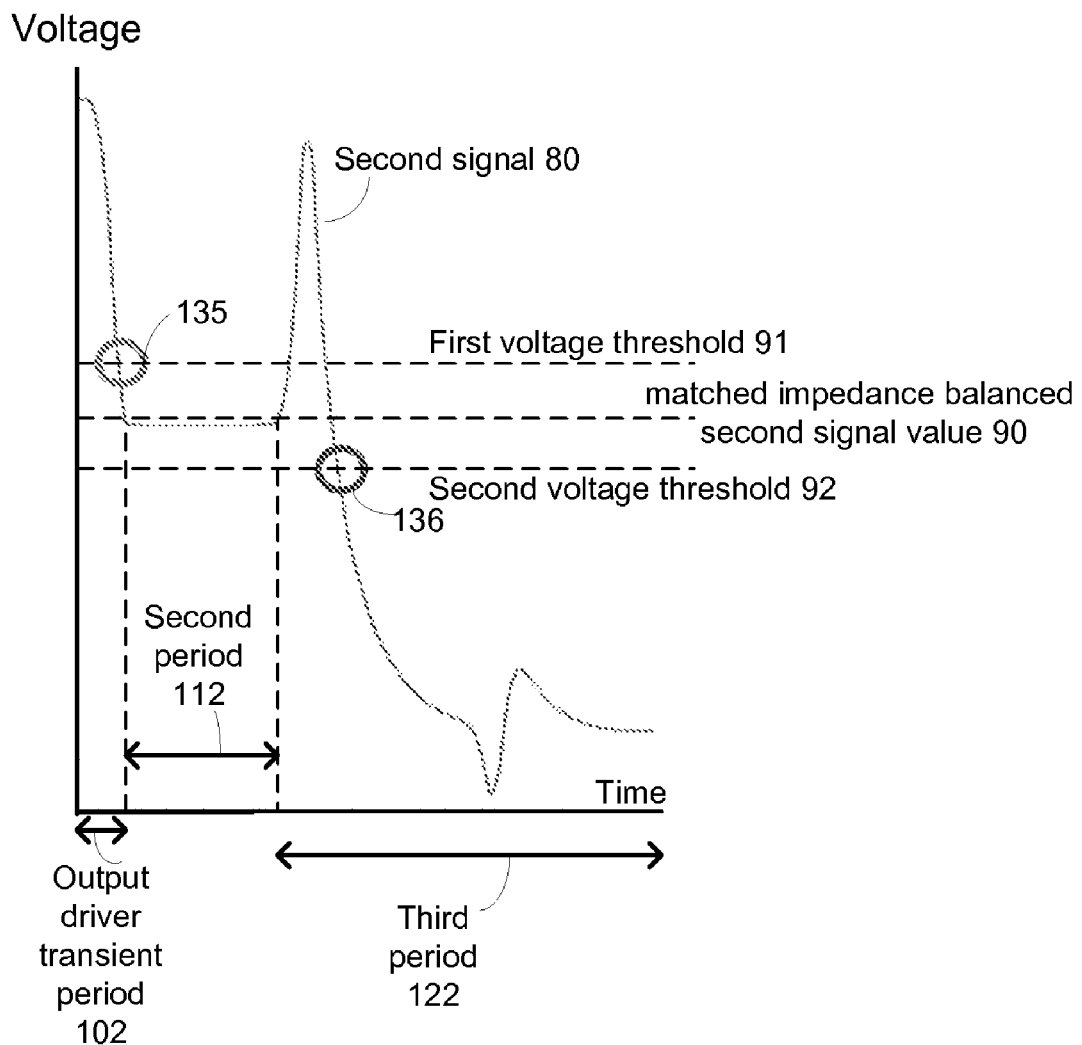

FIGS. 2A, 2B, 2C and 2D illustrate various waveforms and especially voltage thresholds crossings. It is noted that the signals are captured at the output driver. FIG. 2A illustrates first square wave signal 70 and the corresponding second signal 80, wherein the time spans represented by the horizontal axes of the two graphs match to each other (it will be apparent that the graphs of FIGS. 2A, 2B, 2C and 2D are only of explanatory character, and that first square wave signal 70 and second signal 80 vary over time, and between different embodiments of the invention). FIGS. 2B, 2C and 2D illustrate example of the second signal 80 where the impedance of output driver 30 is too high (FIG. 2B), where the impedance of output driver 30 is too low (FIG. 2C), and where the impedances of the output driver 30 and the transmission line 22 match (FIG. 2D).

Second signal 80, which is responsive to first square wave signal 70, has a characteristic response to first square wave signal transient 72. It is noted that whereas in FIGS. 2A through 2D first square wave signal transient 72 is from a high level of first square wave signal 70 to a low level of first square wave signal 70, second signal 80 has another characteristic response for first square wave signal transient 72 which is from a low level of first square wave signal 70 to a high level thereof. The response of second signal 80 to first square wave signal transient 72 typically includes three periods: (a) output driver transient period 100, 101, 102 (respectively), in which second signal voltage increases or decreases (in compliance with the trend of first square wave signal transient 72), (b) second period 110, 111, 112 (respectively) in which second signal 80 has a "flat" voltage during the time, corresponding to the twice signal flight time through the transmission line, and (c) third period 120, 121, 122 (respectively) in which signal 80 peaks back in a trend opposing that of first square wave signal transient 72, and than changes in a trend corresponding to that of first square wave signal transient 72 which corresponds to the typical reflection from the transmission line with parasitic capacitance at the open-end (open-end termination).

Conveniently, matched impedance balanced second signal value 90 complies with the level of second signal 80 during second period 110 where the impedances match (as illustrated in FIG. 2D). Where the impedances are mismatched, the level of second signal 80 during second period 110 is either higher than matched impedance balanced second signal value 90 (if the impedance of output driver 30 is too high (compared with the TLS impedance) as illustrated in FIG. 2B), or lower than matched impedance balanced second signal value 90 (if the impedance of output driver 30 is too low, as illustrated in FIG. 2C).

FIG. 2B illustrates second signal 80 when the impedance of output driver 30 is too high (so-called under-drive state). In this case the crossings of both first voltage threshold 91 (the crossing point is denoted 131) and second voltage threshold 92 (the crossing point is denoted 131) occur after output driver transient period 100 ends (after the end of the flat period 110). FIG. 2C illustrates second signal 80 when the impedance of output driver 30 is too low (so-called over-drive state). In this case the crossings of both first voltage threshold 91 (the crossing point is denoted 133) and second voltage threshold 92 (the crossing point is denoted 134) occur within output driver transient period 101 (or before the start of the "flat" period 111). FIG. 2D illustrates second signal 80 when the impedance of output driver 30 is close enough to match the impedance of the transmission line 22. In this case the crossings of one of the voltage threshold (in the illustrated case, of first voltage threshold 91) occurs within output driver transient period 102 (the crossing point is denoted 135), and the crossing of the other voltage threshold (in the illustrated case, of second voltage threshold 92) occurs after output driver transient period 102 and the "flat" period 112 end and the reflection signal from the end of the transmission line comes (the crossing point is denoted 136). It is noted that in the case of perfectly terminated end of the TLS the second crossing 136 will never be detected.

Referring now to FIG. 1, in view of FIGS. 2A through 2D, monitor circuit 40 can determine if an adjustment of the impedance of output driver 30 is required in response to the values of second signal 80 during output driver transient period 100. Referring to first voltage threshold 91 which is higher than matched impedance balanced second signal value 90, and to second voltage threshold 92 which is lower than matched impedance balanced second signal value 90 (wherein the voltage differences between each of the first and the second voltage thresholds to matched impedance balanced second signal value 90 are conveniently set in response to a desired level of accuracies, according to relevant criteria).

If the impedance of output driver 30 is too high, the level of second signal 20 will reach neither of first and second voltage threshold during output signal transient period 100 (FIG. 2B); that if the impedance of output driver 30 is too low, the level of second signal 80 will reach both of first and second voltage threshold during output signal transient period 101 (FIG. 2C); and that if the impedances match, the level of second signal 80 will reach only one of the voltage threshold (FIG. 2D)(the voltage threshold reached depends on the trend of first square wave signal transient 72).

In an example of an embodiment, monitoring circuit 40 compares temporal values of second signal 80, during output driver transient period 100, 101, 102, to first voltage threshold 91 that is above matched impedance balanced second signal value 90.

In an example of an embodiment, first square wave signal voltage transient 72 is from a high level of first square wave signal 70 to a low level of first square wave signal 70 (as illustrated in FIGS. 2A through 2D), wherein controller 44 decreases the impedance of output driver 30 if during output driver transient period 100 all temporal values of second signal 80 were above first voltage threshold 91 (as illustrated in FIG. 2B).

In an example of an embodiment, first square wave signal voltage transient 72 is from a low level of first square wave signal 70 to a high level of first square wave signal 70 (not illustrated), wherein controller 44 increases the impedance of output driver 30 if during output driver transient period 100 a temporal value of second signal 80 equaled first voltage threshold 91 and exceeds the first voltage threshold.

In an example of an embodiment, monitoring circuit 40 compares temporal values of second signal 80, during output driver transient period 100, 101, 102, to second voltage threshold 92 that is below matched impedance balanced second signal value 90.

In an example of an embodiment in which monitoring circuit 40 compares temporal values of second signal 80, during output driver transient period 100, 101, 102, to second voltage threshold 92, wherein first square wave signal voltage transient 72 is from a low level of first square wave signal 70 to a high level of first square wave signal 70, controller 44 decreases the impedance of output driver 30 if during output driver transient period 100, 101, 102 all temporal values of second signal 80 were below second voltage threshold 92.

In an example of an embodiment in which monitoring circuit 40 compares temporal values of second signal 80, during output driver transient period 100, 101, 102, to second voltage threshold 92, wherein first square wave signal voltage transient 72 is from a high level of first square wave signal 70 to a low level of first square wave signal 70, controller 44 increases the impedance of output driver 30 if during output driver transient period 100 a temporal value of second signal 80 equaled second voltage threshold 92 and was lower then the second voltage threshold.

It is noted that, in an example of an embodiment, monitoring circuit 40 is activated on each transient of first square wave signal 70 of a certain type (i.e. high level to low level, and low level to high level). In an example of an embodiment, monitoring circuit 40 is activated on each transient of first square wave signal 70 of any type. In an example of an embodiment, the determining of the adjustment needed for the impedance of output driver 30 is carried out using a predetermined determining first square wave signal that is provided to output driver 30 by impedance adjustment circuit 60.

In an example of an embodiment, monitoring circuit 40 compares temporal values of second signal 80, during output driver transient period 102, to first voltage threshold 91 and to second voltage threshold 92; wherein controller 44 determines not to adjust the impedance of output driver 30 if during output driver transient period 102 a temporal value of second signal 80 equaled one voltage threshold out of first voltage threshold 91 and second voltage threshold 92, and all other temporal values of second signal 80 differed from another threshold of the first and second thresholds (such as illustrated by FIG. 2D).

It is noted that monitoring circuit 40 conveniently includes: (a) first comparator 41 that is adapted to receive second signal 80 and signal of first voltage threshold 91 voltage, and to provide a first comparison result to controller 44, and (b) second comparator 42 that is adapted to receive second signal 80 and signal of second voltage threshold 92 voltage, and to provide a second comparison result to controller 44.

In an example of an embodiment, matched impedance balanced second signal value 90 is substantially equal to half of a difference between maximal and minimal temporal values of second signal 80; wherein first voltage threshold 91 is slightly above matched impedance balanced second signal value 90 and wherein second voltage threshold 92 is slightly below matched impedance balanced second signal value 90.

Figure 3A:
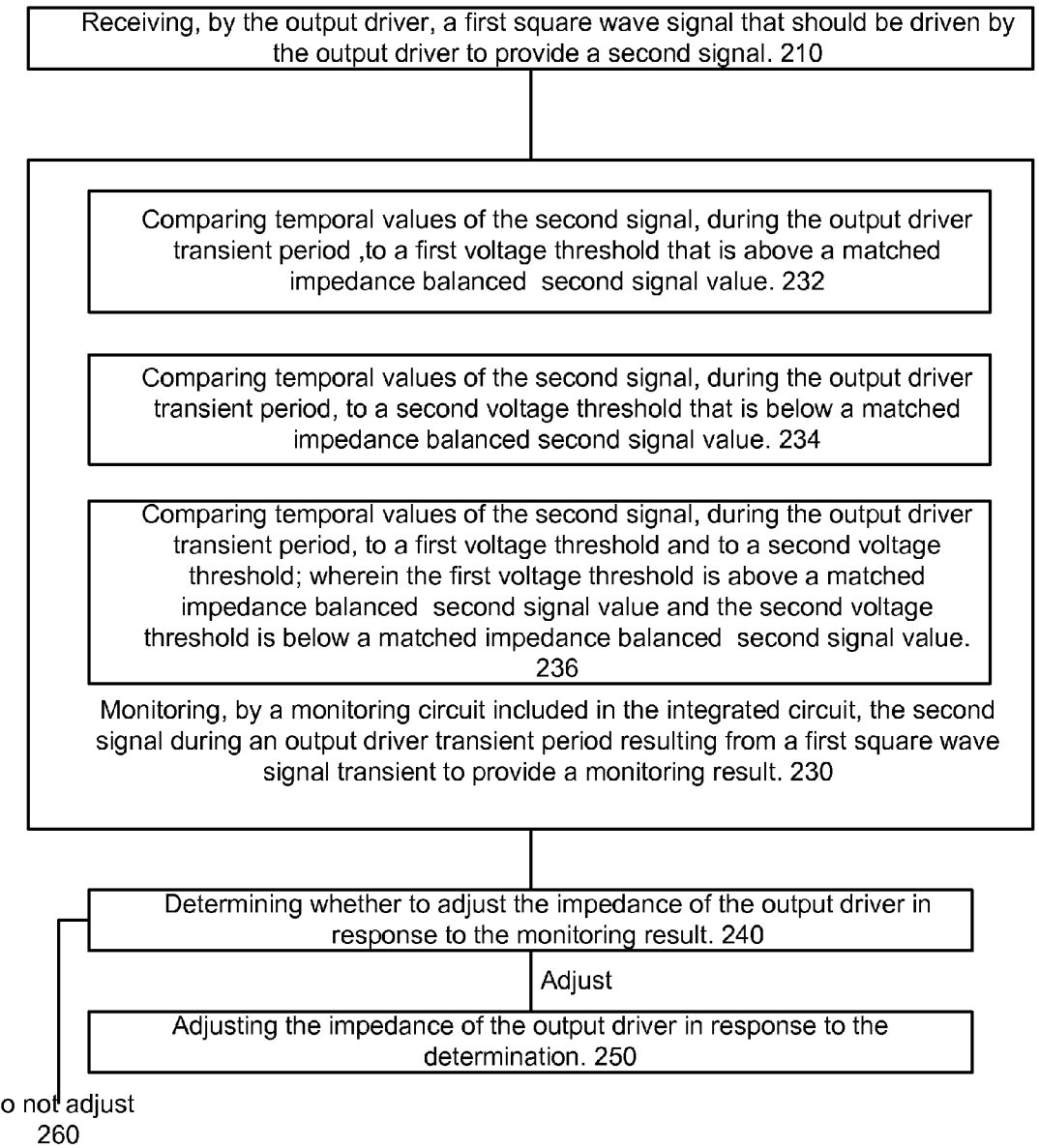
FIG. 3A is a flow chart of an example of an embodiment of a method for adjusting an impedance of an output driver of an integrated circuit.

FIG. 3A is a flow chart of method 200 for adjusting an impedance of an output driver, in an example of an embodiment. Referring to the examples set forward in the previous drawings, method 200 is conveniently carried out by device 10, and especially by impedance adjustment circuit 60. Furthermore, it is noted that different embodiments of method 200 are carried out by different aforementioned embodiments of device 10. Therefore, it will be apparent that the description of method 200 and of embodiments thereof may benefit when viewed with references to the description of device 10 and of embodiments thereof.

Method 200 starts by stage 210 of receiving, by the output driver, a first square wave signal that should be driven by the output driver to provide a second signal. Referring to the examples set forward in the previous drawings, stage 210 is conveniently carried out by output driver 30.

Stage 210 is followed by stage 230 of monitoring the second signal, by a monitoring circuit included in the integrated circuit, during an output driver transient period resulting from a first square wave signal transient, to provide a monitoring result. Referring to the examples set forward in the previous drawings, stage 230 is conveniently carried out by monitoring circuit 40.

In an example of an embodiment, the monitoring includes stage 232 of comparing temporal values of the second signal, during the output driver transient period, to a first voltage threshold that is above a matched impedance balanced second signal value.

In an example of an embodiment, the monitoring includes stage 234 of comparing temporal values of the second signal, during the output driver transient period, to a second voltage threshold that is below a matched impedance balanced second signal value.

In an example of an embodiment, the monitoring includes stage 236 of comparing temporal values of the second signal, during the output driver transient period, to a first voltage threshold and to a second voltage threshold; wherein the first voltage threshold is above a matched impedance balanced second signal value and the second voltage threshold is below a matched impedance balanced second signal value.

It is noted that, in an example of an embodiment, stage 230 of monitoring is associated with FIGS. 2A through 2D, and with the formerly offered discussion thereof.

In an example of an embodiment, the monitoring is applied on each transient of the first square wave signal of a certain type (i.e. high level to low level, and low level to high level). In an example of an embodiment, the monitoring is applied on each transient of the first square wave signal of any type.

Stage 230 is followed by stage 240 of determining whether to adjust the impedance of the output driver in response to the monitoring result. Referring to the examples set forward in the previous drawings, stage 240 is conveniently carried out by controller 44. It is noted that, in an example of an embodiment, stage 240 of determining is associated with FIGS. 2A through 2D, and with the formerly offered discussion thereof.

Referring now to FIG. 3B, in an example of an embodiment, stage 240 includes stage 241 of determining to decrease the impedance of the output driver if the first square wave signal transient is from a high level of the first square wave signal to a low level of the first square wave signal and if during the output driver transient period all temporal values of the second signal were above the first voltage threshold.

In an example of an embodiment, stage 240 includes stage 242 of determining to Increase the impedance of the output driver if during the output driver transient period a temporal value of the second signal equaled the first voltage threshold and if the first square wave signal transient is from a low level of the first square wave signal to a high level of the first square wave signal.

In an example of an embodiment, stage 240 includes stage 243 of determining to decrease the impedance of the output driver if during the output driver transient period all temporal values of the second signal were below the second voltage threshold and if the first square wave signal transient is from a low level of the first square wave signal to a high level of the first square wave signal.

In an example of an embodiment, stage 240 includes stage 244 of determining to increase the impedance of the output driver if during the output driver transient period a temporal value of the second signal equaled the second voltage threshold and if the first square wave signal transient is from a high level of the first square wave signal to a low level of the first square wave signal.

In an example of an embodiment, stage 240 includes stage 245 of determining not to adjust the impedance of the output driver if during the output driver transient period a temporal value of the second signal equaled one voltage threshold out of the first and second voltage thresholds and all other temporal values of the second signal differed from another threshold of the first and second thresholds.

Referring now back to FIG. 3A, stage 240 is followed by stage 250 of adjusting the impedance of the output driver in response to the determination. It is however noted that if during the determining, the determination is not to adjust the impedance of the output driver (such as in stage 245), stage 250 is not carried out, but rather the impedance of the output driver is left unchanged (denoted 260). Referring to the examples set forward in the previous drawings, stage 250 is conveniently carried out by controller 44, and especially, in an example of an embodiment, by output driver strength control circuit 48.

Referring to FIG. 3C, in an example of an embodiment, stage 250 includes stage 251 of decreasing the impedance of the output driver if the first square wave signal transient is from a high level of the first square wave signal to a low level of the first square wave signal and if during the output driver transient period all temporal values of the second signal were above the first voltage threshold.

In an example of an embodiment, stage 250 includes stage 252 of increasing the impedance of the output driver if during the output driver transient period a temporal value of the second signal equaled the first voltage threshold and if the first square wave signal transient is from a low level of the first square wave signal to a high level of the first square wave signal.

In an example of an embodiment, stage 250 includes stage 253 of decreasing the impedance of the output driver if during the output driver transient period all temporal values of the second signal were below the second voltage threshold and if the first square wave signal transient is from a low level of the first square wave signal to a high level of the first square wave signal.

In an example of an embodiment, stage 250 includes stage 254 of increasing the impedance of the output driver if during the output driver transient period a temporal value of the second signal equaled the second voltage threshold and if the first square wave signal transient is from a high level of the first square wave signal to a low level of the first square wave signal.

Because the apparatus implementing the present invention is, for the most part, composed of electronic components and circuits the design of which is, from the above, easily derivable for a person skilled in the art based, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

We claim:

1. A method for adjusting an impedance of an output driver of an integrated circuit; the method comprises:
receiving, by the output driver, a first square wave signal that should be driven by the output driver to provide a second square wave signal;
monitoring, by a monitoring circuit included in the integrated circuit, the second square wave signal during an output driver transient period resulting from a first square wave signal transient to provide a monitoring result, wherein the monitoring comprises comparing temporal values of the second signal, during the output driver transient period, to at least one voltage threshold out of a first voltage threshold and a second voltage threshold, wherein the first voltage threshold is above a matched impedance balanced second signal value, wherein the second voltage threshold is below the matched impedance balanced second signal value, and wherein the first and second voltage thresholds are between steady state values of the second signal; wherein the output driver transient period is followed by a second period during which the second signal has a constant voltage, the second period corresponds to twice a signal flight time through a transmission line coupled to the output driver; wherein the second period is followed by a third period during which the first square signal peaks back in a trend opposing that of the first square wave signal transient;
determining whether to adjust the impedance of the output driver in response to the monitoring result; and
adjusting the impedance of the output driver in response to the determination.

2. The method according to claim 1 wherein the monitoring comprises comparing temporal values of the second signal, during the output driver transient period, to the first voltage threshold.

3. The method according to claim 2 wherein the first square wave signal transient is from a high level of the first square wave signal to a low level of the first square wave signal and wherein the adjusting comprises decreasing the impedance of the output driver if during the output driver transient period all temporal values of the second signal were above the first voltage threshold.

4. The method according to claim 2 wherein the first square wave signal transient is from a low level of the first square wave signal to a high level of the first square wave signal and wherein the adjusting comprises increasing the impedance of the output driver if during the output driver transient period a temporal value of the second signal equaled the first voltage threshold or exceeded the first voltage threshold.

5. The method according to claim 1 wherein the monitoring comprises comparing temporal values of the second signal, during the output driver transient period, to the second voltage threshold.

6. The method according to claim 5 wherein the first square wave signal transient is from a low level of the first square wave signal to a high level of the first square wave signal and wherein the adjusting comprises decreasing the impedance of the output driver if during the output driver transient period all temporal values of the second signal were below the second voltage threshold.

7. The method according to claim 5 wherein the first square wave signal transient is from a high level of the first square wave signal to a low level of the first square wave signal and wherein the adjusting comprises increasing the impedance of the output driver if during the output driver transient period a temporal value of the second signal equaled the second voltage threshold or was lower than the second voltage threshold.

8. The method according to claim 1 wherein the monitoring is applied on each transient of the first square wave signal of a certain type.

9. The method according to claim 1 wherein the monitoring comprises comparing temporal values of the second signal, during the output driver transient period, to the first voltage threshold and to the second voltage threshold; wherein the first voltage threshold is above the matched impedance balanced second signal value and the second voltage threshold is below the matched impedance balanced second signal value; and determining not to adjust the impedance of the output driver if during the output driver transient period a temporal value of the second signal equaled one voltage threshold out of the first and second voltage thresholds and all other temporal values of the second signal differed from another threshold of the first and second thresholds.

10. The method according to claim 9 wherein the matched impedance balanced second signal value is substantially equal to a value, which is a half of a difference between maximal and minimal temporal values of the second signal; wherein the first voltage threshold is slightly above the matched impedance balanced second signal value and wherein the second voltage threshold is slightly below the matched impedance balanced second signal value.

11. A device having impedance adjusting capabilities; the device comprises:
an output driver of an integrated circuit; wherein the output driver receives a first square wave signal and converts it to a second signal; and
an impedance adjustment circuit coupled to the output driver; wherein the impedance adjustment circuit is included in the integrated circuit; wherein the impedance adjustment circuit comprises a monitoring circuit and a controller;
wherein the monitoring circuit monitors the second signal during an output driver transient period resulting from a first square wave signal transient so as to provide a monitoring result, wherein the monitoring circuit compares temporal values of the second signal, during the output driver transient period, to at least one voltage threshold out of a first voltage threshold and a second voltage threshold, wherein the first voltage threshold is above a matched impedance balanced second signal value, wherein the second voltage threshold is below the matched impedance balanced second signal value, and wherein the first and second voltage thresholds are between steady state values of the second signal;
wherein the output driver transient period is followed by a second period during which the second signal has a constant voltage, the second period corresponds to twice a signal flight time through a transmission line coupled to the output driver; wherein the second period is followed by a third period during which the first square signal peaks back in a trend opposing that of the first square wave signal transient;
wherein the controller receives the monitoring result, determines whether to adjust an impedance of the output driver in response to the monitoring result, and adjusts the impedance of the output driver in response to the determination.

12. The device according to claim 11 wherein the monitoring circuit compares temporal values of the second signal, during the output driver transient period, to the first voltage threshold.

13. The device according to claim 12 wherein the first square wave signal transient is from a high level of the first square wave signal to a low level of the first square wave signal and wherein the controller decreases the impedance of the output driver if during the output driver transient period all temporal values of the second signal were above the first voltage threshold.

14. The device according to claim 12 wherein the first square wave signal transient is from a low level of the first square wave signal to a high level of the first square wave signal and wherein the controller increases the impedance of the output driver if during the output driver transient period a temporal value of the second signal equaled the first voltage threshold or exceeded the first voltage threshold.

15. The device according to claim 11 wherein the monitoring circuit compares temporal values of the second signal, during the output driver transient period, to the second voltage threshold.

16. The device according to claim 15 wherein the first square wave signal transient is from a low level of the first square wave signal to a high level of the first square wave signal and wherein the controller decreases the impedance of the output driver if during the output driver transient period all temporal values of the second signal were below the second voltage threshold.

17. The device according to claim 15 wherein the first square wave signal transient is from a high level of the first square wave signal to a low level of the first square wave signal and wherein the controller increases the impedance of the output driver if during the output driver transient period a temporal value of the second signal equaled the second voltage threshold or was lower than the second voltage threshold.

18. The device according to claim 11 wherein the monitoring circuit is activated on each transient of the first square wave signal of a certain type.

19. The device according to claim 11 wherein the monitoring circuit compares temporal values of the second signal, during the output driver transient period, to the first voltage threshold and to the second voltage threshold; wherein the first voltage threshold is above the matched impedance balanced second signal value and the second voltage threshold is below the matched impedance balanced second signal value; and wherein the controller determines not to adjust the impedance of the output driver if during the output driver transient period a temporal value of the second signal equaled one voltage threshold out of the first and second voltage thresholds and all other temporal values of the second signal differed from another threshold of the first and second thresholds.

20. The device according to claim 19 wherein the matched impedance balanced second signal value is substantially equal to half of a difference between maximal and minimal temporal values of the second signal; wherein the first voltage threshold is slightly above the matched impedance balanced second signal value and wherein the second voltage threshold is slightly below the matched impedance balanced second signal value.

* * * * *